(12) United States Patent
Kyogoku et al.

(10) Patent No.: US 6,743,329 B1
(45) Date of Patent: Jun. 1, 2004

(54) SEALING MECHANISM OF MULTI-CHAMBER LOAD-LOCKING DEVICE

(75) Inventors: Mitsusuke Kyogoku, Tama (JP); Takayuki Yamagishi, Tama (JP)

(73) Assignee: ASM Japan K.K., Tama (JP)

( * ) Notice: Subject to any disclaimer, the term of this patent is extended or adjusted under 35 U.S.C. 154(b) by 67 days.

(21) Appl. No.: 09/650,122

(22) Filed: Aug. 29, 2000

(30) Foreign Application Priority Data

Aug. 30, 1999 (JP) ............................................. 11-243598

(51) Int. Cl.[7] .................... H01L 21/00; C23C 16/00; B65G 1/06
(52) U.S. Cl. .................. 156/345.32; 118/733; 414/935; 74/24
(58) Field of Search ................. 156/345.32; 118/733; 414/935, 217; 74/24; 251/368

(56) References Cited

U.S. PATENT DOCUMENTS

| | | | | |
|---|---|---|---|---|
| 4,134,305 A | * | 1/1979 | Hautau | 74/24 |
| RE30,188 E | * | 1/1980 | Predhome, Jr. | 74/57 |
| 4,241,687 A | * | 12/1980 | DuBois et al. | 440/63 |
| 4,889,319 A | * | 12/1989 | Phillips et al. | 251/368 |
| 5,885,690 A | * | 3/1999 | Sada | 428/141 |
| 6,053,686 A | * | 4/2000 | Kyogoku | 414/217 |
| 6,059,507 A | * | 5/2000 | Adams | 414/217 |

\* cited by examiner

*Primary Examiner*—Parviz Hassanzadet
*Assistant Examiner*—Ram N Kackar
(74) *Attorney, Agent, or Firm*—Knobbe, Martens, Olson & Bear, LLP

(57) ABSTRACT

In a multi-chamber load-locking device which is placed between a loading station which places a wafer cassette which houses semiconductor wafers and a transfer chamber which conveys the semiconductor wafers and in which lock-loading device chamber space is divided into two by the vertical motion of a plate, a device which comprises: sealing means by which the chamber space is selectively divided into two by contacting the plate and a state of no airflow is caused; a cylindrical cam provided with the same axis as that of the chamber; and a rotary actuator dynamically connected with the cylindrical cam, wherein the turning moment of the rotary actuator is converted into the vertical thrust of the axis and the plate rises and descends.

5 Claims, 1 Drawing Sheet

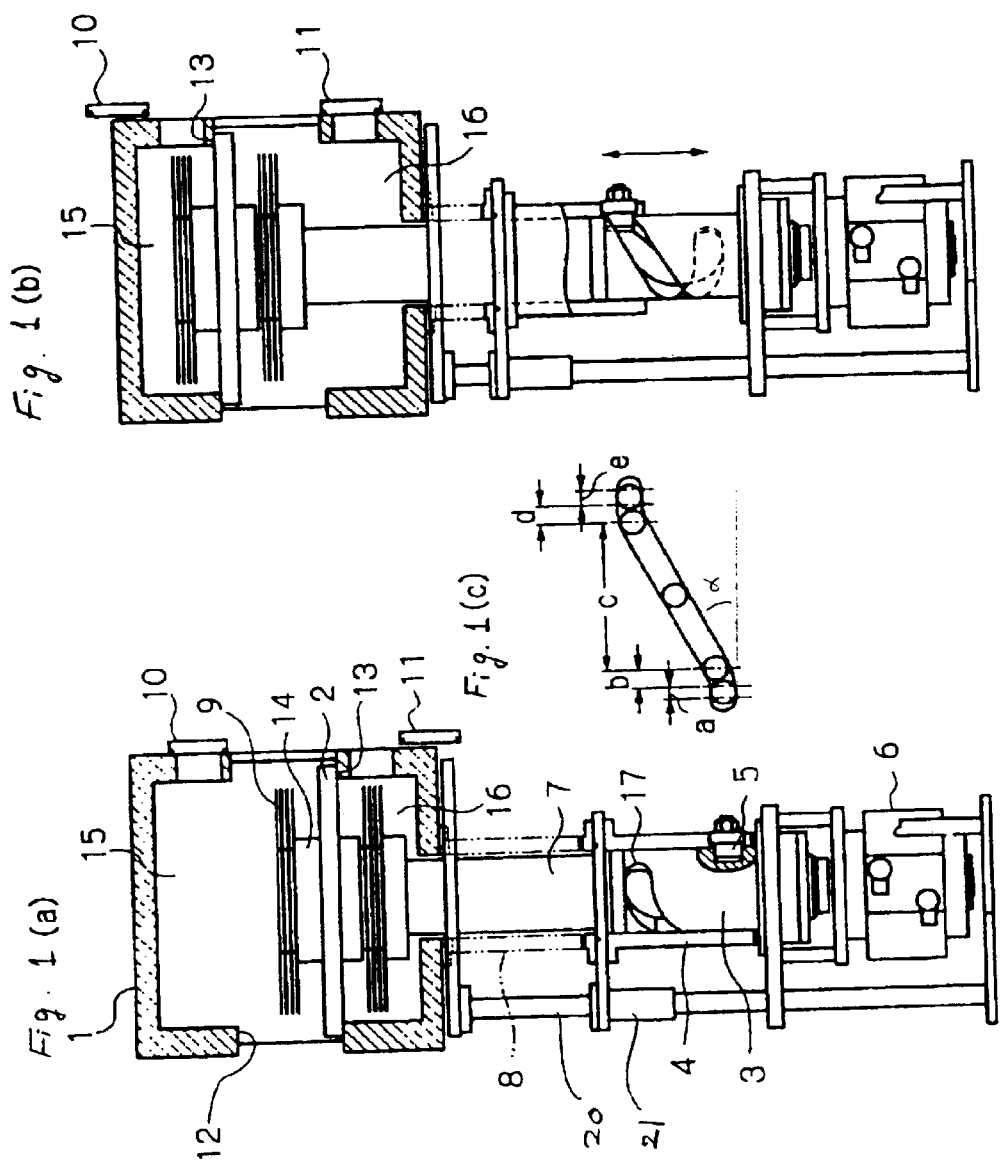

SEALING MECHANISM OF MULTI-CHAMBER LOAD-LOCKING DEVICE

BACKGROUND OF THE INVENTION

1. Field of the Invention

This invention relates to a vacuum chamber for semiconductor manufacturing and it particularly relates to a sealing mechanism of a load-locking chamber.

2. Description of the Related Art

To reduce the device area of a semiconductor-manufacturing device, in place of a transfer chamber, devices for which a load-locking chamber and a reactor chamber were constructed in three dimensions were introduced. These are devices in which, for example, a plate capable of moving vertically, which is provided inside a wafer transfer chamber, seals the opening of a load-locking chamber or a reactor chamber, which is provided in the upper part of the wafer transfer chamber, and causes a state of no airflow for both chambers.

When replacing a wafer, because the pressure within a load-locking chamber becomes atmospheric pressure and a transfer chamber is under vacuum, a plate is sucked into the transfer chamber under great force due to the pressure difference between them. When processing a wafer with a diameter of 200 mm and if the diameter of the plate is approximately 300 mm, this sucking force is approximately 700 Kg.

Normally, to hold a plate against this sucking force, an electromagnetic brake is used. Because this brake uses friction, it is gradually worn away and periodic maintenance becomes necessary.

For manufacturing a wafer with a diameter of 300 mm, the diameter of a plate must be enlarge to approximately 400 mm, and the sucking force will reach approximately 1300 Kg. To accommodate these changes, an electromagnetic brake will become larger and the frequency of maintenance work will increase.

Additionally, in a multi-chamber load-locking device for which a load-locking chamber is divided into two by the vertical motion of a plate, the plate receives a sucking force in the reverse direction at two upper and lower sealing positions. As a result, the frequency of maintenance work including brake readjustment increases.

Further, a plate needs to move quickly to improve productivity. At the time of sealing, the plate, however, needs to slow down immediately before a sealing position to prevent particle contamination from an O-ring seal. Likewise, when the plate separates from the seal, it should move slowly and the moving speed should increase after the plate separates from the seal completely.

Thus, in a multi-chamber load-locking device, complex operation control such as change in moving speeds, operation of a brake, and maintenance become necessary.

Consequently, an object of this invention is to provide, with simple construction, a maintenance-free multi-chamber load-locking device which is equipped with an automatic motion control mechanism for a plate.

SUMMARY OF THE INVENTION

To achieve the above-mentioned object, this invention comprises structures described below. In an embodiment of the present invention, a multi-chamber load-locking device is placed between a loading station which places a wafer cassette which houses semiconductor wafers, and a transfer chamber which conveys the semiconductor wafers. The device's chamber space is divided into two by the vertical motion of a plate which comprises sealing structures with which the chamber space is selectively divided into two by contacting the plate and a state of no airflow is caused. A cylindrical cam is provided with the same axis as that of the chamber; and a rotary actuator is connected dynamically with the cylindrical cam. Accordingly, the turning moment of the rotary actuator is converted to the vertical thrust of the axis and in that the plate rises and descends.

Preferably, the groove is threaded so that the moving speed decreases immediately before the plate contacts the sealing surface and the plate is locked in a state of rest when it contacts the sealing surface.

In an embodiment, sealing structures are formed by O-rings.

The multi-chamber load-locking device of the present invention can be used with various devices for transferring wafers between zones having different pressures. In an embodiment, the present invention can be applied to a multi-chamber load-locking device for transferring wafers between a first-pressure area and a second-pressure area, said device having an interior divided into (i) an upper chamber and (ii) a lower chamber, both of which are for transferring wafers at the second pressure, and (iii) an intermediate section located between the upper chamber and the lower chamber, which is for loading/unloading wafers at the first pressure, said device comprising a divider plate having an upper side and a lower side, both of which are for temporarily supporting wafers, said plate moving reciprocally between an upper position and a lower position. In the above, when the plate is at the upper position, the plate divides and seals the upper chamber from the intermediate section and the lower chamber, wherein the upper chamber is at the second pressure while the intermediate section and the lower chamber are at the first pressure, whereby wafers at the upper side of the plate are transferred between the first-pressure area and the second-pressure area via the upper chamber, and when the plate is at the lower position, the plate divides and seals the lower chamber from the intermediate section and the upper chamber, wherein the lower chamber is at the second pressure while the intermediate section and the upper chamber are at the first pressure, whereby wafers at the lower side of the plate are transferred between the first-pressure area and the second-pressure area via the lower chamber. In the embodiment of the present invention, the device further comprising: a cylindrical cam structure co-axially connected to said plate, wherein said plate moves between the first position and the second position by rotation of the cylindrical cam structure; and a rotary actuator for rotating the cylindrical cam structure.

In an embodiment, the cam structure comprises a cam cylinder having a cam groove which rotates with the rotary actuator, and a support cylinder having a cam follower which support cylinder is attached to the plate and does not rotate, wherein the cam follower is fitted in the cam groove and moves vertically when the cam groove rotates, said support cylinder being provided inside or outside the cam cylinder.

In the above, the cam groove can have a shape threaded into five sections constituted by (I) an upper horizontal section for locking the plate at the upper position, (II) a lower horizontal section for locking the plate at the lower position, (III) a an intermediate section for moving the plate at a predetermined rate, (IV) an upper transition section for connecting the upper horizontal section and the intermediate section, and (V) a lower transition section for connecting the lower horizontal section and the intermediate section, The moving speed of the plate decreases immediately before sealing the upper chamber and the lower chamber with the plate when the cam follower is in the upper transition section and the lower transition section, respectively; the plate is locked upon sealing the upper chamber and the lower chamber when the cam follower is in the upper horizontal section and the lower horizontal section, respectively; and the plate moves vertically at a rate when the cam follower is in the intermediate section.

Additionally, the device may further comprises a vertical beam provided in parallel to the axis of the cam cylinder, and a sliding support which is affixed to the support cylinder and slides on the beam when the support cylinder moves vertically.

For purposes of summarizing the invention and the advantages achieved over the prior art, certain objects and advantages of the invention have been described above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description of the preferred embodiments which follow.

BRIEF DESCRIPTION OF THE DRAWINGS

These and other features of this invention will now be described with reference to the drawings of preferred embodiments which are intended to illustrate and not to limit the invention.

FIGS. 1(a) and 1(b) are partial cross sections of a load-locking device according to this invention, and FIG. 1(c) is a developed view of a cam groove.

DETAILED DESCRIPTION OF THE PREFERRED EMBODIMENT

This invention is explained referring to the figures in the following:

FIG. 1 is a partial cross section of a multi-chamber type of load-locking device according to this invention.

The device according to this invention is placed between a loading station (not shown) which places a wafer cassette which houses semiconductor wafers 9 and a transfer chamber (not shown) which conveys the semiconductor wafers 9, is provided at a limiting point of the vertical motion of the plate 2 in a load-locking chamber 1 in which chamber space is divided into two by a vertical motion of the plate 2, comprises sealing means (12, 13) by which chamber space is divided into two by a vertical motion of the plate 2 and the chamber space is selectively divided into two by contacting the plate and a state of no airflow is caused, a cylindrical cam 3 which is provided downward with the same axis as the axis of the load-locking chamber 1 and has a groove 17 threaded at the stated angle, a cylinder 4 which is linked with the axis 7 of the load-locking chamber and encircles the cylindrical cam 3, a cam follower 5 which is fixed around the lower end of the cylinder 4 and is set into the groove 17 and a rotary actuator 6 which is connected with the cylindrical cam 3, and which is characterized in that the cylindrical cam 3 rotates by the turning moment of the rotary artuator 6, the cam follower 5 moves upwards or downwards while sliding along the groove 17 and according to these movements the plate 2 rises and descends as well A bellows 8 is provided around the axis 7 which is located outside the load-locking chamber 1 to prevent particle contamination from the outside air. On the front and back sides of the plate 2, a supporting means 14 for loading the semiconductor wafers 9 is provided.

FIG. 1(a) shows a sealing position where the plate 2 is at the lowest position and seals a sealing surface 13. The load-locking chamber 1 is divided into two chambers (15, 16). The two chambers have no airflow. Semiconductor wafers 9 are brought in via a gate valve 11 from a load station to the second chamber 16. At this time, a pressure within the second chamber is atmospheric pressure. A gate valve 10 of the first chamber 15 is shut and the air is exhausted by a vacuum pump (not shown). At this time, force generated by a pressure difference between two chambers acts in the direction from the second chamber to the first chamber. The first chamber 15 is connected to the transfer chamber (not shown). As shown in the figure, the volume in the first chamber is greater than that in the second chamber.

FIG. 1(b) shows a position where the plate 2 is at the highest position and seals the sealing surface 13. As a result, the load-locking chamber 1 is divided into two chambers (15, 16). The two chambers have no airflow. Semiconductor wafers 9 are brought in via the gate valve 10 from the load stations to the first chamber 15. At this time, a pressure within the first chamber 15 is atmospheric pressure. The gate valve 11 of the second chamber is shut and the air is exhausted by a vacuum pump (not shown). At this time, force generated by a pressure difference between the two chambers acts in the direction from the first chamber to the second chamber. The second chamber 16 is connected with the transfer chamber (not shown). As shown in the figure, the volume in the second chamber is greater than that in the first chamber.

O-rings are preferably used for the sealing surfaces (12, 13), but other sealing means can also be used.

FIG. 1(c) is a developed view of a groove threaded in the cylindrical cam 3. The groove comprises five portions. In other words, this groove comprises a flat self-locking range (a), a speeding-up or slowing-down range (b) with a changing slope, a range (c) with the stated slope moving at a fixed speed, a slowing-down or speeding-up range (d) with a changing slope and a self-locking range (e). One end of the cam follower 5 sets into this groove. The cam follower 5 is fixed around the lower end of the cylinder 4. The cylindrical cam 3 rotates by the rotary actuator 6 and the cam follower 5 moves while sliding or rotating within this groove.

A locus of the cam follower 5 is linked to the vertical motion of the plate 2. When the cam follower 5 is in the range (a), the plate 2 is sealed at the lowest position (FIG. 1(a)). In this position, the gate valve 11 opens and a processed wafer is replaced with an unprocessed wafer. At this time, the cam follower 5 is in the self-locking range (a) and is set against the force involving the plate 2 by the pressure difference. As the cylindrical cam 3 rotates by the rotary actuator 6, the cam follower 5 passes the range (b) and gradually begins rising and the plate 2 gradually leaves the sealing surface 13 and begins rising. The cam follower is next in the range (c) and continues rising at a fixed speed and the plate 2 also rises at a fixed speed. When the cam follower approaches the range (d), the plate 2 is at the position immediately before the upper limit of the sealing surface 12 and slowly reduces its moving speed. When the cam follower reaches the range (e), the plate 2 contacts the sealing surface 12 and is self-locked (FIG. 1(*b*)). At this position, the gate valve 10 opens and a processed wafer is replaced with an unprocessed wafer. At this time, the cam follower 5 is in the self-locking range (e) and is against the force involving the plate 2 by a pressure difference.

When the plate 2 descends from the highest position, the movements become entirely opposite to those movements described above.

When the cam follower 5 is in the range (e), the plate 2 is sealed at the highest position (FIG. 1(*b*)). At this position, the gate valve 10 opens and a processed wafer is replaced with an unprocessed wafer. At this time, the cam follower 5 is in the self-locking range (e) and is against the force involving the plate 2 by a pressure difference. As the cylindrical cam 3 rotates by the rotary actuator 6, the cam follower 5 passes the range (d) and gradually begins descending and the plate 2 gradually leaves the sealing surface 12 and begins descending. The cam follower is in the range (c) and continues descending at a fixed speed and the plate 2 also descends at a fixed speed. When the cam follower approaches the range (b), the plate 2 is at the position immediately before the lowest sealing surface 13 and slowly reduces its moving speed. When the cam follower reaches the range (a), the plate 2 contacts the sealing surface 13 and is self-locked (FIG. 1 (*a*)). At this position, the gate valve 11 opens and a processed wafer is replaced with an unprocessed wafer. At this time, the cam follower 5 is in the self-locking range (a) and is against the force involving the plate 2 by a pressure difference.

In an embodiment, the length of (a) and the length of (e) are substantially the same, and the length of (b) and the length of (d) are substantially the same. The ratio of (a)/(b)/(c) may be approximately 1/2/10, for example. The angle of slope ($\alpha$) of the range (c) may be 20–30 degree (for example, 28 degree). The vertical distance the cam follower travels may be approximately 12 cm, for example. The width of the groove may be approximately 3.5 cm, for example. The length of the groove may be shorter than the circumference of the cylindrical cam. The cylindrical cam and the cam follower may be made of stainless steel or carbon steel (S45C), especially Indent treated carbon steel (Indent L.SL-(BL)).

Further, the cam follower may be provided in an inner cylinder positioned inside the cylindrical cam, instead of the outer cylinder positioned outside the cylindrical cam in FIGS. 1(*a*) and 1(*b*).

In addition, in order to secure the plate 2 evenly along each of the circumferential sealing surfaces 12 and 13, a beam 20 provided in parallel to the cylindrical cam 3, and a sliding support 21, which is affixed to the cylinder 4 and slides on the beam 20, can effectively be used.

[The Efficacy of This Invention]

In a mechanism that converts the rotational motion of a rotary actuator into the vertical motion of a plate by a cylindrical cam, by optimizing the shape of a groove threaded in the cylindrical cam, complex speed control and brake readjustment have become unnecessary.

Additionally, in a sealing position of the plate, a mechanism of holding the plate in a state of rest against the force generated by a pressure difference between the chambers can be provided.

It will be understood by those of skill in the art that numerous and various modifications can be made without departing from the spirit of the present invention. Therefore, it should be clearly understood that the forms of the present invention are illustrative only and are not intended to limit the scope of the present invention.

What is claimed is:

1. A multi-chamber load-locking device for transferring wafers, said device having an interior divided into (i) an upper chamber and (ii) a lower chamber, and (iii) an intermediate section located between the upper chamber and the lower chamber, which is for loading/unloading wafers, said device comprising (a) a single divider plate having an upper side and a lower side, both of which are for temporarily supporting wafers, said plate moving reciprocally between an upper position and a lower position, wherein the plate divides and seals the upper chamber from the intermediate section and the lower chamber at the upper position, and the plate divides and seals the lower chamber from the intermediate section and the upper chamber at the lower position, wherein each of the upper chamber and the lower chamber has a sealing surface where the upper chamber and the lower chamber are sealed with the plate, said sealing surface being formed by an O-ring;

(b) a cylindrical cam structure co-axially linked to said plate, wherein said plate moves between the first position and the second position by the rotation of the cylindrical cam structure; and (c) a rotary actuator for driving and rotating the cylindrical cam structure, wherein said cam structure comprises (1) a cam cylinder having a cam groove which rotates with the rotary actuator, and (2) a support cylinder having a cam follower being provided outside the cam cylinder, wherein the plate, the cam cylinder, the support cylinder, and the rotary actuator are co-axial, while the support cylinder is attached to the plate and does not rotate, wherein the cam follower is fitted in the cam groove and moves vertically when the cam groove rotates, said support cylinder, said groove spiraling around a circumference of the cylinder, said groove comprising (I) an upper horizontal section for locking the plate at the upper position, where the cam follower is securely locked in the cam groove, (II) a lower horizontal section for locking the plate at the lower position where the cam follower is securely locked in the cam groove, (III) a straight middle section for moving the plate at a fixed rate, (IV) an upper transition section connecting the upper horizontal section and the straight middle section for moving the plate at a rate lower than the fixed rate, and (V) a lower transition section connecting the lower horizontal section and the straight middle section for moving the plate at a rate lower than the fixed rate, wherein the length of each section in a horizontal direction is (I)<(IV)<(III)>(V)>(II), said device further comprising (d) a vertical beam for supporting the support cylinder, provided in parallel to the axis of the support cylinder, and (e) a sliding support which slides on the beam,
    wherein said support cylinder is connected to the sliding support, and moves along the beam vertically when the claim cylinder rotates.

2. The device as claimed in claim 1, which is adapted to be disposed between a loading station which places a wafer cassette accommodating semiconductor wafers, and a transfer chamber which conveys the semiconductor wafers, wherein the intermediate section is connected to the transfer chamber, and the upper chamber and the lower chamber are connected to the loading station.

3. The device as claimed in claim 1, wherein the vertical beam is disposed opposite to the cam follower with respect to the axis of the cam cylinder, the support cylinder, and the rotary actuator.

4. The device as claimed in claim 1, wherein the groove spirals around substantially one circumference of the cylinder.

5. The device as claimed in claim 1, wherein the cam cylinder and the cam follower are made of indent treated carbon steel.

* * * * *